United States Patent
Li et al.

(10) Patent No.: US 9,630,830 B2
(45) Date of Patent: Apr. 25, 2017

(54) MEMS RESONATOR ACTIVE TEMPERATURE COMPENSATION METHOD AND THERMALLY-ACTUATED MEMS RESONATOR

(71) Applicant: NATIONAL TSING HUA UNIVERSITY, Hsinchu (TW)

(72) Inventors: Sheng-Shian Li, Taoyuan County (TW); Cheng-Chi Chen, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 605 days.

(21) Appl. No.: 14/178,298

(22) Filed: Feb. 12, 2014

(65) Prior Publication Data

US 2014/0339953 A1 Nov. 20, 2014

(30) Foreign Application Priority Data

May 20, 2013 (TW) .............................. 102117759 A

(51) Int. Cl.
 *B81B 3/00* (2006.01)
(52) U.S. Cl.
 CPC .... *B81B 3/0081* (2013.01); *B81B 2201/0271* (2013.01)
(58) Field of Classification Search
 CPC ........ B81B 7/00; B81B 7/008; B81B 7/0083; B81B 7/0087; B81B 2201/0271; B81B 2201/0278; G01K 1/20
 USPC ........... 310/300; 374/1, 133, E1.023; 73/574
 See application file for complete search history.

(56) References Cited

U.S. PATENT DOCUMENTS

| | | | |
|---|---|---|---|
| 7,221,241 B2 | 5/2007 | Lutz et al. | |
| 7,427,905 B2 | 9/2008 | Lutz et al. | |
| 7,924,109 B2 | 4/2011 | Ogasawara | |
| 2004/0207489 A1* | 10/2004 | Lutz | B81B 3/0072 333/186 |
| 2005/0195050 A1* | 9/2005 | Lutz | H03H 9/02338 333/186 |
| 2007/0290364 A1* | 12/2007 | Gupta | B81B 7/007 257/777 |
| 2011/0080224 A1* | 4/2011 | Lander | B81B 3/0072 331/154 |
| 2011/0175492 A1 | 7/2011 | Stoffels et al. | |

(Continued)

OTHER PUBLICATIONS

Chen et al., "Enhancement of Temperature Stability Via Constant-Structural-Resistance Control for MEMS Resonators", Micro Electro Mechanical Systems (MEMS), 2013 IEEE 26th International Conference, Jan. 20-24, 2013, pp. 765-768.

*Primary Examiner* — Lisa Caputo
*Assistant Examiner* — Philip Cotey
(74) *Attorney, Agent, or Firm* — CKC & Partners Co., Ltd.

(57) ABSTRACT

A MEMS resonator active temperature compensation method is provided. The MEMS resonator active temperature compensation method includes: a MEMS resonator is provided, wherein a structural resistance of the MEMS resonator is varied with an environmental temperature; a structural resistance shift value is formed by a variation of the environmental temperature; an electrical circuit is provided, wherein the electrical circuit is electrically connected with the MEMS resonator for providing an adjustment mechanism to the MEMS resonator; and a compensation value is provided from the adjustment mechanism for controlling the structural resistance shift value.

7 Claims, 13 Drawing Sheets

(56) References Cited

U.S. PATENT DOCUMENTS

| | | | |
|---|---|---|---|
| 2011/0215877 A1* | 9/2011 | Koning | H03H 9/02448 331/70 |
| 2011/0304405 A1 | 12/2011 | Lander | |
| 2012/0032555 A1* | 2/2012 | Koning | H03H 9/02448 310/315 |
| 2012/0075027 A1* | 3/2012 | van Beek | H03H 9/02448 331/70 |
| 2012/0188023 A1* | 7/2012 | Rottenberg | H03H 9/02338 331/156 |
| 2012/0229226 A1* | 9/2012 | Oja | B81B 3/0081 331/158 |
| 2012/0268216 A1 | 10/2012 | Borremans | |
| 2012/0286903 A1* | 11/2012 | Prunnila | B81B 3/0072 333/234 |
| 2013/0093525 A1* | 4/2013 | Le Phan | H03B 5/32 331/35 |
| 2013/0285676 A1* | 10/2013 | Rahafrooz | H03H 3/0072 324/633 |

\* cited by examiner

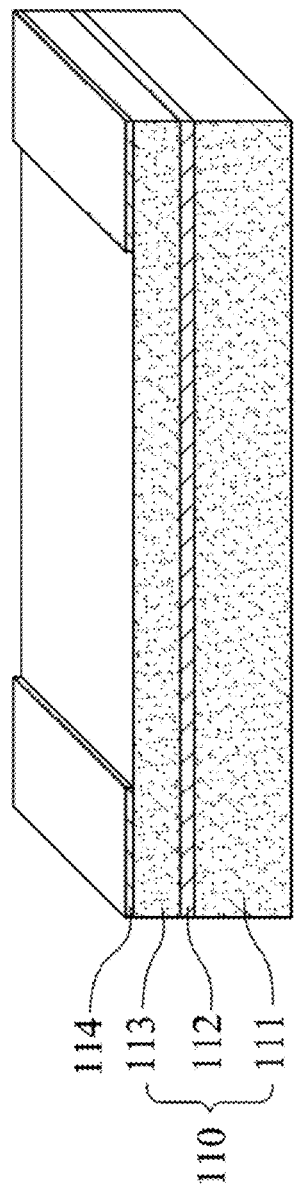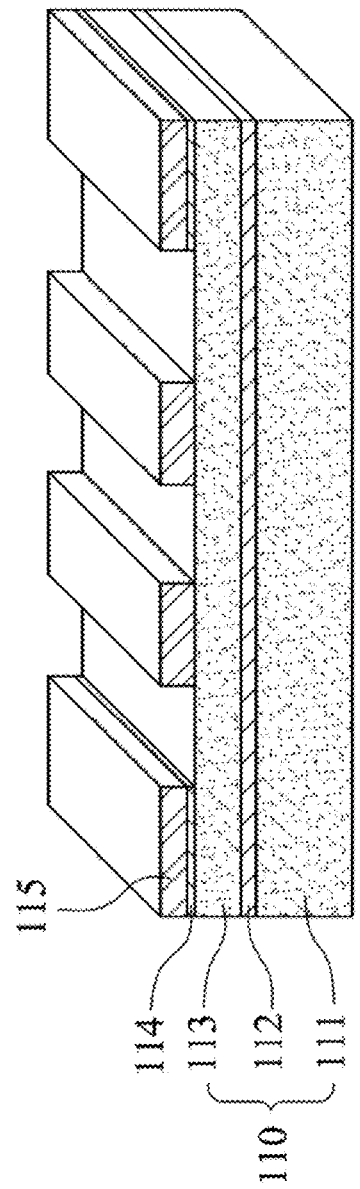

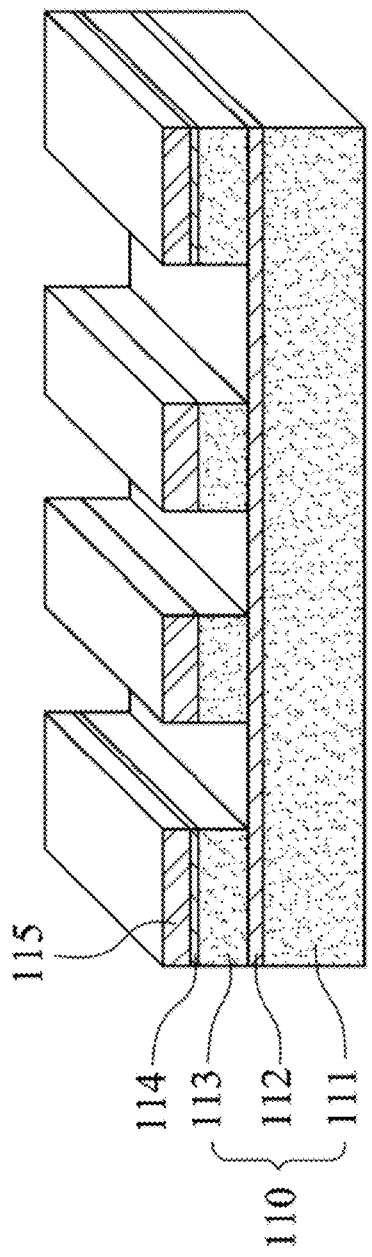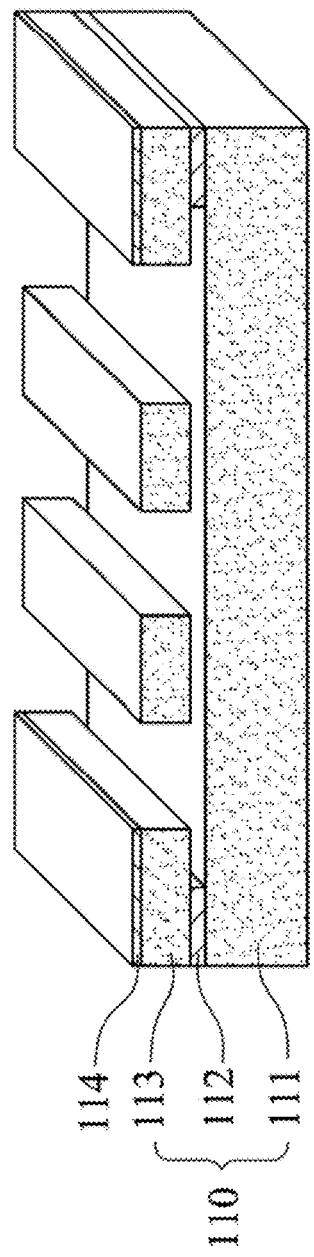
Fig. 2C
Fig. 2D

MEMS RESONATOR ACTIVE TEMPERATURE COMPENSATION METHOD AND THERMALLY-ACTUATED MEMS RESONATOR

RELATED APPLICATIONS

The application claims priority to Taiwan Application Serial Number 102117759, filed on May 20, 2013, which is herein incorporated by reference.

BACKGROUND

Technical Field

The present disclosure relates to a MEMS (microelectromechanical systems) resonator compensation method and a MEMS resonator, especially relates to a MEMS resonator active temperature compensation method and a thermally-actuated MEMS resonator.

Description of Related Art

With the increasing demands on the miniaturization of the electronic devices and the progress on the micromachining technology, it is possible to integrate huge amount of electronic components in a single chip. Many different components such as mechanical components, chemical components, optoelectronic components, bio system components and microfluidic components can be integrated into a single chip for achieving strong and diversified performances. In these electric components, MEMS resonators are the most representative products. Many companies have devoted into the manufacturing of the MEMS resonators.

MEMS resonators play an important role in various applications, such as sensing, actuating, and signal processing owing to excellent mechanical high Q. A general purpose of the resonator is generating frequencies which is essential in a wireless communication system, a signal processing system, or an electric circuit system. Conventional discrete electric components such as capacitance and inductance have Q factor only less than 100 which is too low to apply in an electric system for high performance, not to mention the extremely low Q of CMOS inductance and capacitance of less than 10. The mechanical resonator can provide low energy loss enabling the Q factor thereof is larger than 10000.

Therefore, mechanical resonators with high Q factor have been embedded in many electric devices such as SAW filters and quartz resonators. Main functions of the mechanical resonators are for providing frequency selection or frequency generation in high-performance oscillators or filters which are not available in conventional electric components. However, owing to too large volume and being independence from a VLSI, the conventional mechanical resonator can't be effectively integrated with an IC circuit and is not favorable for the miniaturization of an electric device.

There are three general driving methods based on electrostatic, piezoelectric or thermal-actuation mechanisms for MEMS resonators. The electrostatic driving method is to adopt an electrostatic force for driving the MEMS resonator. Operationally, when the frequency of the electrostatic force is corresponded to the resonator frequency, the displacement of the resonator structure will be magnified by Q times. As a result, a time-variant motion current is generated from the time-variant capacitance between the resonator structure and sensing electrode, therefore achieving the function of signal generation. The advantages of the electrostatic driving method are: (1) high Q factor and low energy loss; (2) easy integration with CMOS circuitries. The disadvantages of the electrostatic driving method are: (1) weak electro-mechanical coupling capability, therefore large motional impedance is induced so that it's difficult to integrate with a standard 50 Ohm electric circuit system; (2) a parasitic feedthrough effect makes it difficult to measure the weak motion current; (3) complicated fabrication processes are required to form a sub-micron capacitance gap; thereby lowering the manufacturing yield; (4) the Q factor of the resonator will be reduced owing to the influence of air damping between the sub-micron capacitance gap, so an expensive vacuum package is required.

The piezoelectric driving method has good electro-mechanical coupling capability, and the motional resistance thereof is only few ohms and is easily integrated with standard electric circuit system. The disadvantages of the piezoelectric driving method are: (1) the material of a conventional piezoelectric thin-film such as PZT and ZnO is not compatible with CMOS circuit, therefore the manufacturing processes of a piezoelectric-driving resonator is difficult to be integrated with a CMOS circuitry; (2) low Q factor and operation frequency due to intrinsic limitation of the material.

The thermal driving method has been widely utilized in the MEMS actuators. A thermal actuator has advantages on large driving force, large displacement, low operation voltage, low cost and simple processing. However, in traditional view, the thermal actuators has disadvantages on low response time and high energy loss because the designed structures are bulky, thereby requiring a sufficient time, especially in the high frequency range, to heat the large thermal capacitance for obtaining a sufficient thermal-driving force. With the progress on micro-manufacturing technology, the size of the resonator can be reduced to nano scale so that many disadvantages of the thermally-actuated resonator can be improved. The thermal time constant, for example, is shortened proportionally to the volume of the thermal beam but the mechanical operation frequency can be designed to remain the same. When the two-dimensional directions of thermal beams are scaled down in one order for each direction, the thermal-driving force is raised in the magnitude of two orders but the mechanical spring constant of thermal-beam can be the same, thus the operation frequency keeps uncharged under the same motional proof mass. That means as the miniaturization of thermal beam, the thermal-driving force under the same operation power can be raised in the magnitude of two orders for the same designed operation frequency.

However, a silicon-based mechanical resonator suffers an issue of an improper temperature coefficient of frequency ($TC_f$), which means that the oscillation frequency of the resonator will be varied with environmental temperature so that MEMS resonator cannot exploit the real applications such as timing reference, wireless communications, GPS and so on. For example, the $TC_f$ of silicon is typically between −40 to −30 ppm/° C., which means that if the environmental temperature varied from −20° C. to 100° C., the resonance frequency shifts about 4000 ppm. Compared to the frequency stability of less than 1 ppm over the environmental temperature range from −55° C. to 125° C. requiring for mobile phones, there are still 3-order magnitudes of $TC_f$ for silicon-based MEMS resonators to achieve the commercial specification. Therefore, how to control $TC_f$ to zero or a stable value for reducing the influence of the variation of the environmental temperature is an important issue for the silicon-based MEMS resonators no matter what kind of driving mechanism is adopted.

SUMMARY

According to one aspect of the present disclosure, a MEMS resonator active temperature compensation method is provided. The MEMS resonator active temperature compensation method includes: a MEMS resonator is provided, wherein a structural resistance of the MEMS resonator is varied with an environmental temperature; an electrical circuit is provided, wherein the electrical circuit is electrically connected with the MEMS resonator for providing an adjustment mechanism to the MEMS resonator; a structural resistance shift value is formed by the MEMS resonator according to a variation of the environmental temperature; and a compensation value is provided from the adjustment mechanism for controlling the structural resistance shift value.

According to another aspect of the present disclosure, a thermally-actuated MEMS resonator applied to above MEMS resonator active temperature compensation is provided. The thermally-actuated MEMS resonator includes a thermal actuator, two proof masses, two supporting beams, a first electrode and a second electrode. The thermal actuator includes two beams, wherein the two beams are parallel to each other. One of the proof masses is connected to one end of each of the beams, and the other proof mass is connected to the other end of each of the beams. One of the supporting beams is disposed on one side of the beam, and the other supporting beam is disposed on one side of the other beam. The first electrode is electrically connected to one of the support beams, and the second electrode is electrically connected to the other supporting beam.

BRIEF DESCRIPTION OF THE DRAWINGS

The present disclosure can be more fully understood by reading the following detailed description of the embodiment, with reference made to the accompanying drawings as follows:

FIG. 2A to FIG. 2D are schematic views for showing the manufacturing processes of the thermally-actuated MEMS resonator of FIG. 1;

DETAILED DESCRIPTION

The active temperature compensation method of the present disclosure can be applied to various MEMS resonators, and the shape of the applied MEMS resonator is without any restriction. For explanation, the active temperature compensation method is applied to a II-shaped thermally-actuated MEMS resonator according to the following embodiments of the present disclosure. Any other kinds of resonators such as a piezoelectric resonator, a capacitive resonator, a magnetic resonator, or a piezoresistive-sensing resonator as long as the structure of resonator itself provides a proper resistivity which is temperature dependent can be implemented the active temperature compensation method of the present disclosure.

Figure 1:
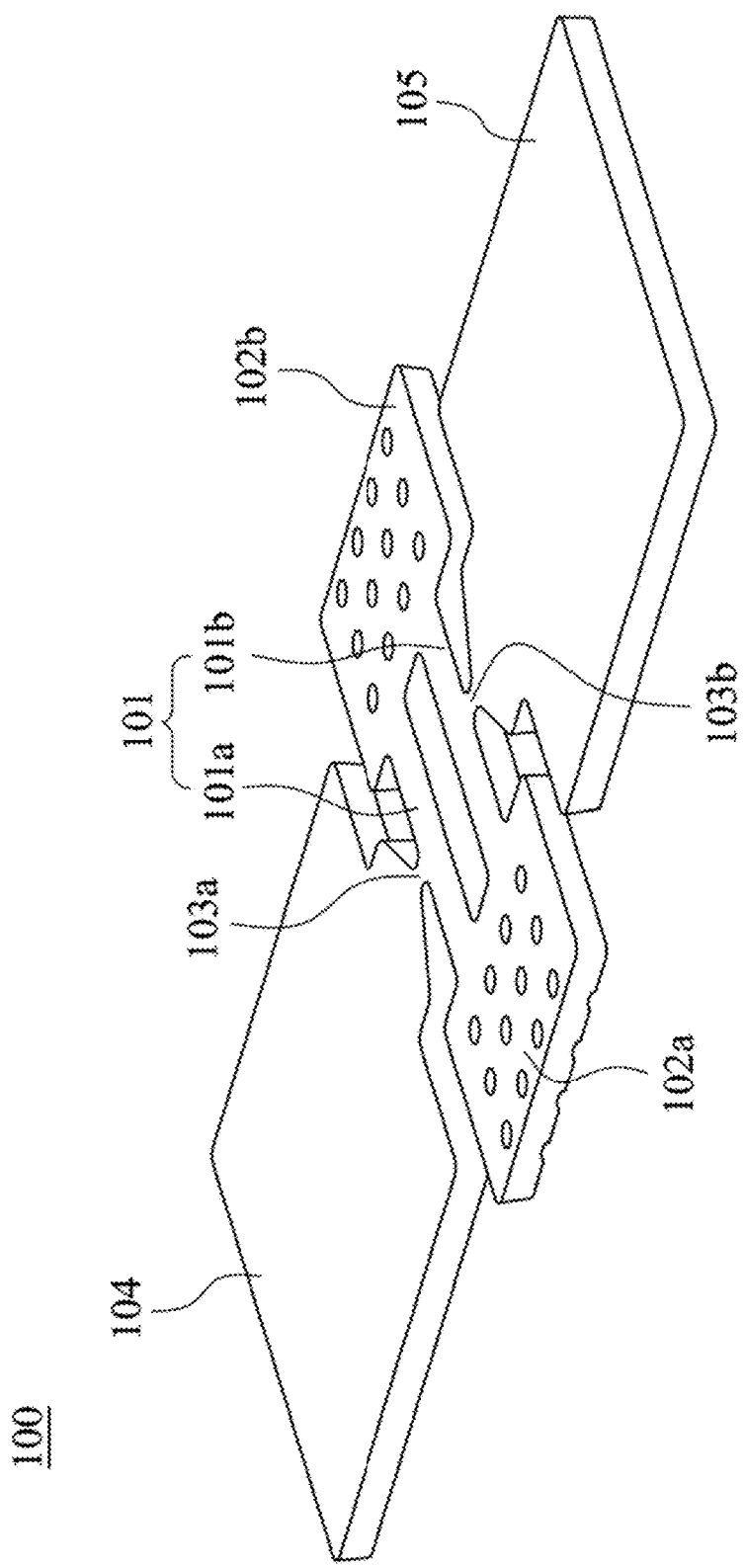
FIG. 1 is a structural view of a thermally-actuated MEMS resonator according to one embodiment of the present disclosure.

FIG. 1 is a structural view of a thermally-actuated MEMS resonator 100 according to one embodiment of the present disclosure. The thermally-actuated MEMS resonator 100 is applied to the active temperature compensation method of the present disclosure, and an essential electric circuit is showed in FIG. 4.

The thermally-actuated MEMS resonator 100 includes a thermal actuator 101, two proof masses (102a, 102b), two supporting beams (103a, 103b), a first electrode 104, and a second electrode 105. The thermal actuator 101 includes two beams (101a, 101b); the beam 101a is parallel to the beam 101b. The proof mass 102a is connected to one end of each of the beam 101a and the beam 101b, the proof mass 102b is connected to the other end of each of the beam 101a and the beam 101b. The supporting beam 103a is disposed on a side of the beam 101a, and the supporting beam 103b is disposed on a side of the beam 101b. The first electrode 104 is electrically connected to the supporting beam 103a, and the second electrode 105 is electrically connected to the supporting beam 103b. In operation, the first electrode 104 and the second electrode 105 is for inputting or outputting a current, the direction of the current is not limited. The quantity of the proof masses (102a, 102b) and the beams (101a, 101b) are not limited, it is possible to use only one beam or one proof mass. Also, the beams (101a, 101b) can be perpendicular to each other.

FIG. 2A to FIG. 2D are schematic views for showing the manufacturing processes of the thermally-actuated MEMS resonator 100 of FIG. 1. The thermally-actuated MEMS resonator 100 can be made of an n-type or p-type SOI wafer, and the fabrication processes include two photolithography processes.

In FIG. 2A, the first photolithography process is performed. Low resistance (0.01~0.02 Ohm-cm, which is not limited) n-type or p-type SOI wafer 110 is chosen as base material, and the SOI wafer 110 includes a substrate 111, an oxide layer 112 and a structural layer 113. The oxide layer 112 is formed on the substrate 111, and the structural layer 113 is formed on the oxide layer 112. The thickness of the structural layer 113 can be 10 µm which is not limited, and the material of the structural layer 113 can be silicon which is also not limited as long as the materials possess electrical conductivity and piezoresistivity. The thickness of the oxide layer 112 can be 5 µm which is not limited, and the material of the oxide layer 112 can be $SiO_2$ which is also not limited. The purpose of oxide layer 112 is for electrical isolation and resonator suspension. The thickness of the substrate 111 can be 500 µm which is not limited, and the substrate 111 has a high or low resistance. After performing the first photolithography process, the electrode position of the thermally-actuated MEMS resonator 100 is determined. Then, a sputtering process is performed to form a 0.1 µm Cr metal layer 114 which is not limited as long as the metal layer is for eliminating the contact resistance while wire-bonding.

In FIG. 2B, the second photolithography process is performed. In FIG. 2B, a photoresist layer 115 is spin-coated on the metal layer 114 of FIG. 2A and the second photolithography process is performed in order to define the main shape of the thermally-actuated MEMS resonator 100. Especially, the thermally-actuated MEMS resonator 100 of the present disclosure can have good resonant performance without sub-micron gap.

In FIG. 2C, a photoresist layer 115 acts as hard mask and an ICP process is performed for the etching from the structural layer 113 to the oxide layer 112.

In FIG. 2D, the photoresist layer 115 is removed by an acetone solution, and a hydrogen-fluoride-based wet etching process is performed to etch the oxide layer 112. The duration of the etching process is 2 hours under 35° C. with a stir beam, which is not limited and is determined by the designed undercut length of resonators. Deionized water is used for removing the etching solution, and isopropyl alcohol solution is for replacing water, so that the structure can be prevented from stiction on the substrate 111. A heating process is performed for evaporating isopropyl alcohol. Finally, the structure of the thermally-actuated MEMS resonator 100 is formed.

In one embodiment, a structure as the thermally-actuated MEMS resonator 100 is chosen; owing to the thermally-actuated MEMS resonator 100 has a large driving force, a large displacement, a low operation voltage, a high Q factor, low cost and a simple manufacturing process. It is also suitable for demonstrating the application of the active temperature compensation method of the present disclosure. The operation principle of the thermally-actuated MEMS resonator 100 is applying a current to the electrode of the thermally-actuated MEMS resonator 100, and then the current produces a thermal-driving force by electro-thermal heating. The thermal-driving force drives the thermally-actuated MEMS resonator 100 for inducing a displacement during resonating, and the displacement leads to the variation of the resistance and a piezo-resistive effect is formed for outputting a piezoresistive sensing signal $g_m$.

It had been mentioned that this kind of thermally-actuated MEMS resonators suffers an issue that the $TC_f$ of the material is large, which means that the resonance frequency will be shifted with the variation of the environmental temperature. The error of the frequency shift has a great influence, for example, on the sensing precision for the sensor applications of the thermally-actuated MEMS resonator. Actually, many temperature compensation methods have been proposed for MEMS resonators, and these temperature compensation methods can be divided into two species, active temperature compensation method and passive temperature compensation method.

The passive temperature compensation method is performed to improve the characteristic of the material for reducing the frequency shift with the environmental temperature variation, and the active temperature compensation method is performed to add an outer control to compensate and stabilize the temperature or to minimize the temperature-frequency variation based on resonance frequency tuning which depends on the resonance driving mechanism or divider design of phase lock loop. For high-end applications, not only the passive temperature compensation method but also the active temperature compensation is a must. For kinds of resonators, conventional active temperature compensation method such as placing a MEMS resonator to an oven or adding a heating electric circuit to a MEMS resonator may improve the frequency stability further. However, the heating electric circuit and oven has large footprint and power consumption because not only the resonator itself but also the outer structure was heated. Besides, the frequency variation from the temperature variation between the outer temperature sensor and resonator itself also limit the frequency stability.

Therefore, a new active temperature compensation method is provided in the present disclosure. The main thinking is that MEMS resonator can be designed to be heated by itself and serve as the in-situ temperature sensor because not only the resonance frequency of the thermally-actuated MEMS resonator 100 is varied with the temperature, but the structural resistance thereof does. Therefore, by this reason, the MEMS resonator active temperature compensation method of the present disclosure has advantages: (a) direct to compensate the resonator operating temperature based on the structural resistance shift value and without an additional external temperature sensor; (b) any outer electric heater is no longer a must, but only essential electric circuit for driving and heating the thermally-actuated MEMS resonator 100 is required. Therefore, the MEMS resonator active temperature compensation method of the present disclosure has simple structure and streamlined components. It is noted that the active temperature compensation method of the present disclosure can not only be applied on the thermally-actuated MEMS resonator 100 of the present disclosure, but can be applied on the MEMS resonator that the resonance frequency and the structural resistance thereof are varied with temperature variation.

Figure 3:
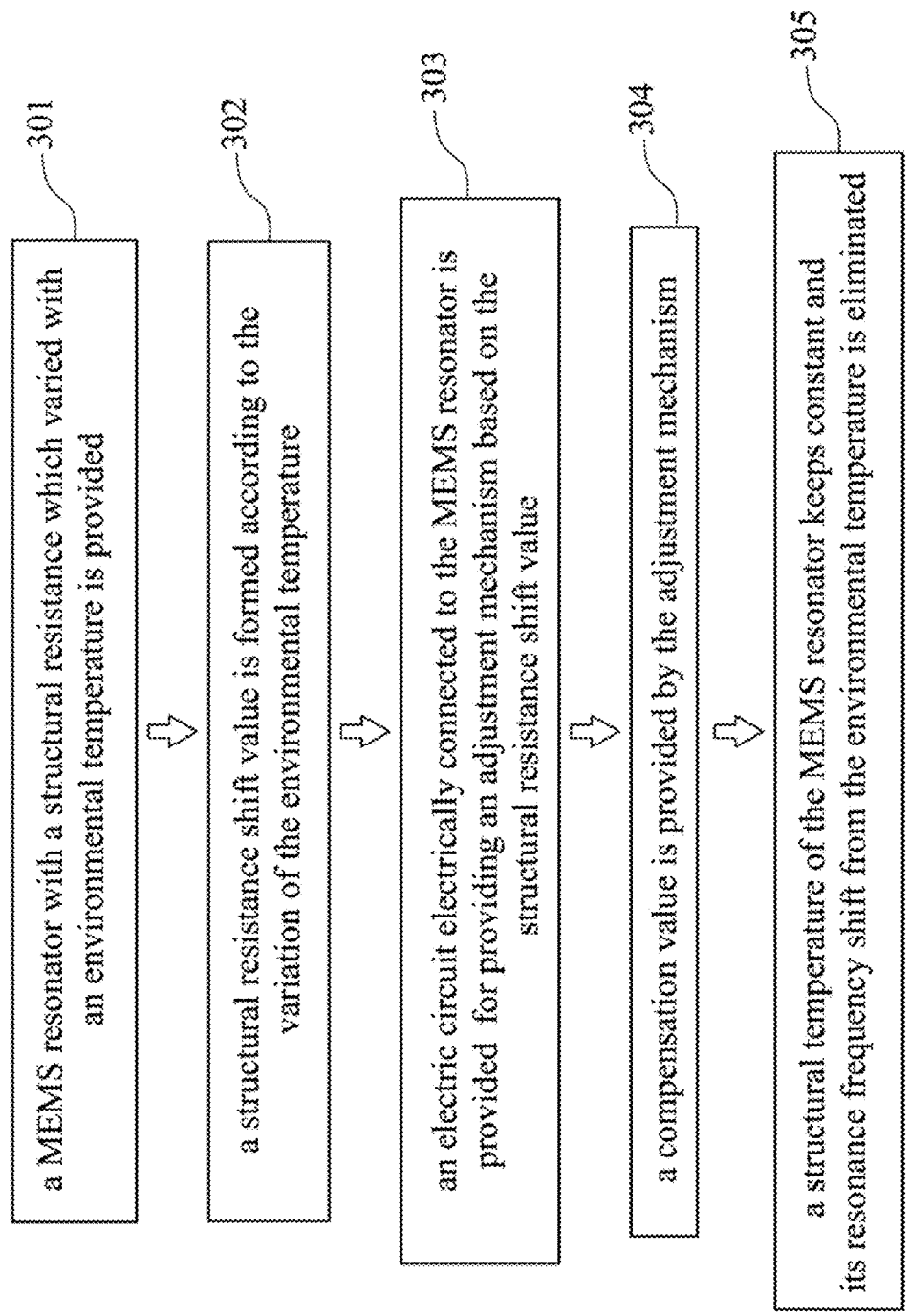
FIG. 3 is a flowchart showing a MEMS resonator active temperature compensation method according to one embodiment of the present disclosure.

FIG. 3 is a flowchart showing a MEMS resonator active temperature compensation method according to one embodiment of the present disclosure. In FIG. 3, the method includes the steps as follows. In step 301, a MEMS resonator with a structural resistance which varied with an environmental temperature is provided. In step 302, a structural resistance shift value is formed according to the variation of the environmental temperature. In step 303, an electric circuit electrically connected to the MEMS resonator is provided for providing an adjustment mechanism based on the structural resistance shift value. In step 304, a compensation value is provided by the adjustment mechanism. The compensation value is for controlling the structural resistance shift value. In step 305, a structural temperature of the MEMS resonator keeps constant and its resonance frequency shift from the environmental temperature is eliminated. That is, the structural resistance shift value can be compensated to be zero or to be stabilized in a predetermined value. Therefore, a resonance frequency shift is calibrated by controlling the structural resistance being zero or stabilized in a predetermined value. In the aforementioned steps, controlling the structural resistance sift value is indirect controlling the resonance frequency sift value. When the environmental temperature rises, the structural resistance is larger, and the structural resistance shift value is positive, so the adjustment mechanism provides a negative compensation value in order to reduce the structural resistance shift value to be zero or to be stabilized in a predetermined value. On the contrary, if the environmental temperature drops, the structural resistance is lower, and the structural resistance shift value is negative, so the adjustment mechanism provides a positive compensation value in order to increase the structural resistance shift value to be zero or to be stabilized in a predetermined value. The adjustment mechanism is providing an adjusting voltage, an adjusting current or an adjusting power to the MEMS resonator.

Figure 4:
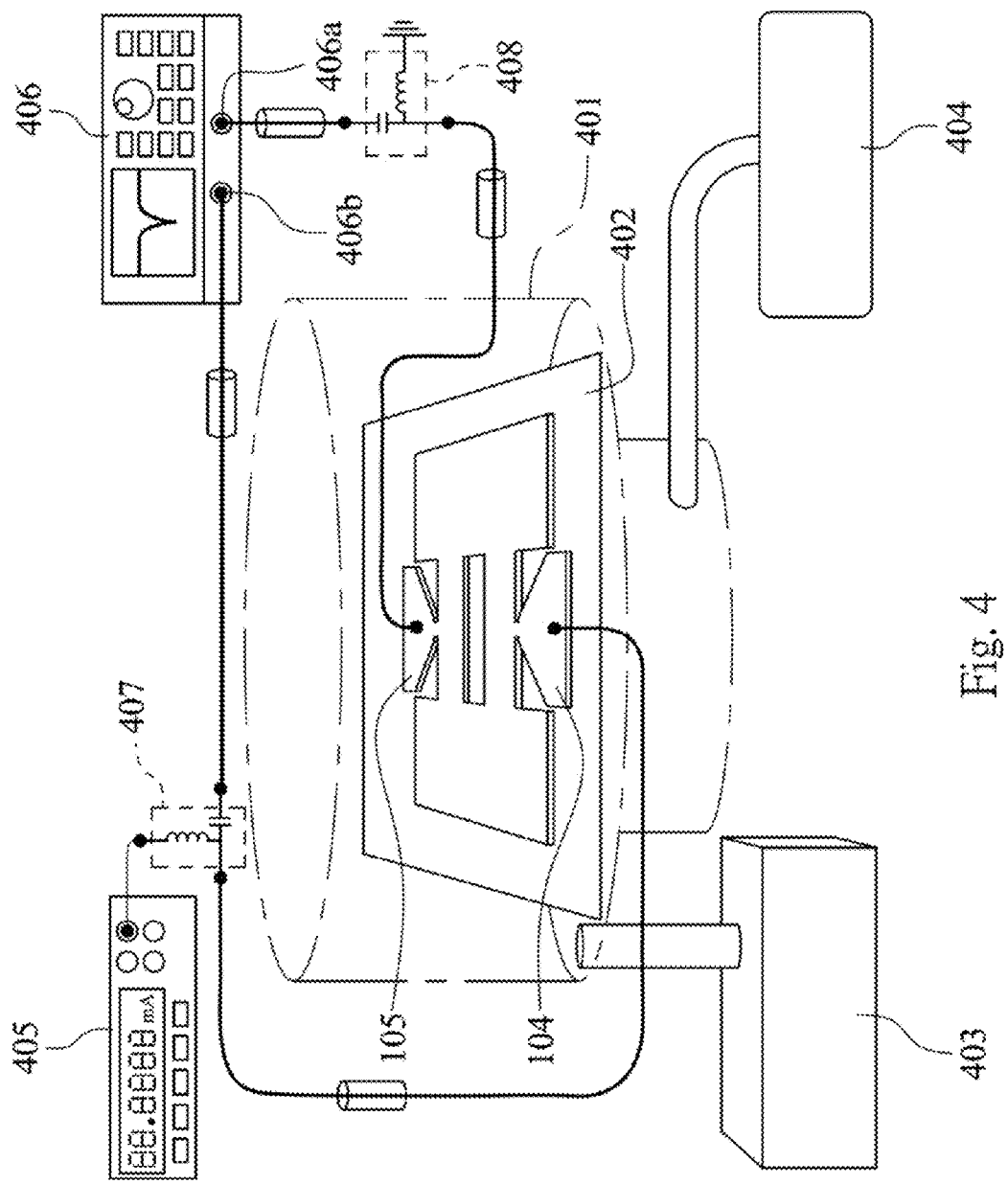
FIG. 4 is a schematic view of the circuit layout of the thermally-actuated MEMS resonator of FIG. 1 which applied to a measurement platform.

FIG. 4 is a schematic view of the circuit layout of the thermally-actuated MEMS resonator 100 of FIG. 1 which applied to a measurement platform. In FIG. 4, the thermally-actuated MEMS resonator 100 is chosen as a resonance generation, wherein the thermally-actuated MEMS resonator 100 is made of a low resistance SOI wafer. The thermally-actuated MEMS resonator 100 is wire-bonded to a PCB, and is placed into a vacuum chamber 401 for preventing the influence from outer signal such as disturbance from air flow. The vacuum of the vacuum chamber 401 is formed by a vacuum pump 403. For simulating the variation of the environmental temperature, the thermally-actuated MEMS resonator 100 is placed on a hot plate 402, and a nitrogen source 404 is disposed in order to perform a steady heating for controlling the environmental temperature. During measurement, tens of mA of the current is required to heat the thermally-actuated MEMS resonator 100 for producing resonance. A Keithley 2410 power supply 405 is connected to the first electrode 104 of the thermally-actuated MEMS resonator 100. The Keithley 2410 power supply 405 is a multifunctional equipment. The Keithley 2410 power supply 405 is also used for measuring the structural resistance of the thermally-actuated MEMS resonator 100. The most important is, the Keithley 2410 power supply 405 is the equipment that provides the adjustment mechanism. For measuring a frequency variation, a Agilent 5071C network analyzer 406 is provided. A port 406a is connected to the second electrode 105 of the thermally-actuated MEMS resonator 100, and a port 406b is connected to the first electrode 104 of the thermally-actuated MEMS resonator 100. In operation, a DC bias is provided from the power supply 405, and a driving AC signal is provided from the Agilent 5071C network analyzer 406. The DC bias and the driving AC signal are applied to the thermally-actuated MEMS resonator 100 by bias-tees 407, 408. At this moment, the current passed through the thermally-actuated MEMS resonator 100 produces a heating effect, when the AC input frequency is the same as the natural resonance frequency of the thermally-actuated MEMS resonator 100; the thermally-actuated MEMS resonator 100 attains the maximum resonance displacement. Then, open the hot plate 402 for heating the thermally-actuated MEMS resonator 100, and use the Keithley 2410 power supply 405 to measure the structural resistance shift value, and apply an adjusting voltage, an adjusting current or an adjusting power to the thermally-actuated MEMS resonator 100 to keep the structural resistance shift value be zero or be stabilized in a predetermined value.

Figure 5:
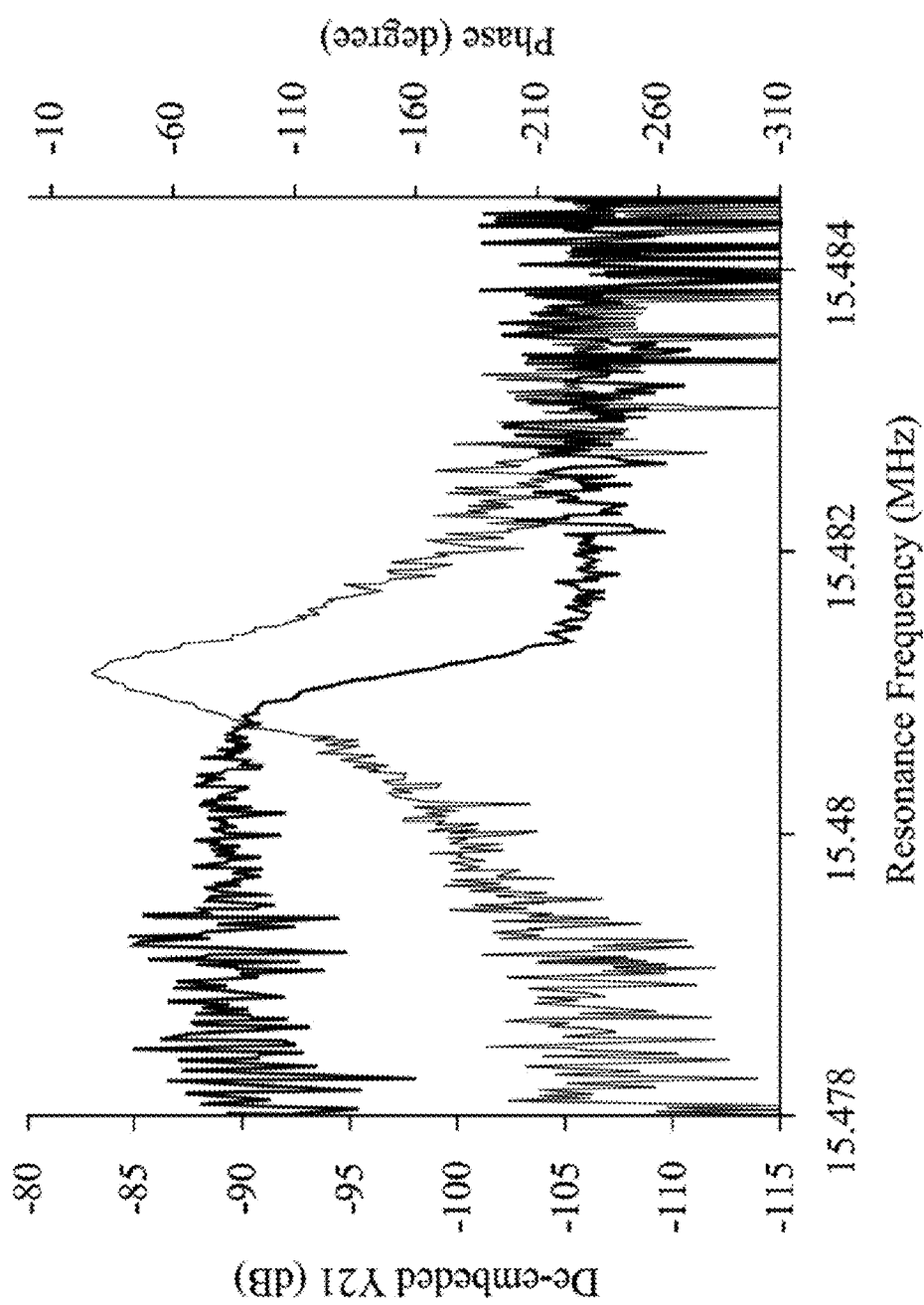
FIG. 5 is a resonance spectrum of an example of the thermally-actuated MEMS resonator of FIG. 1.

FIG. 5 is a resonance spectrum of an example of the thermally-actuated MEMS resonator 100 of FIG. 1. In FIG. 5, the resonance spectrum is measured with de-embedding. The resonance frequency is 15.481 MHz, and the Q factor is 49539 at the temperature of 295K under a vacuum environment.

Figure 6:
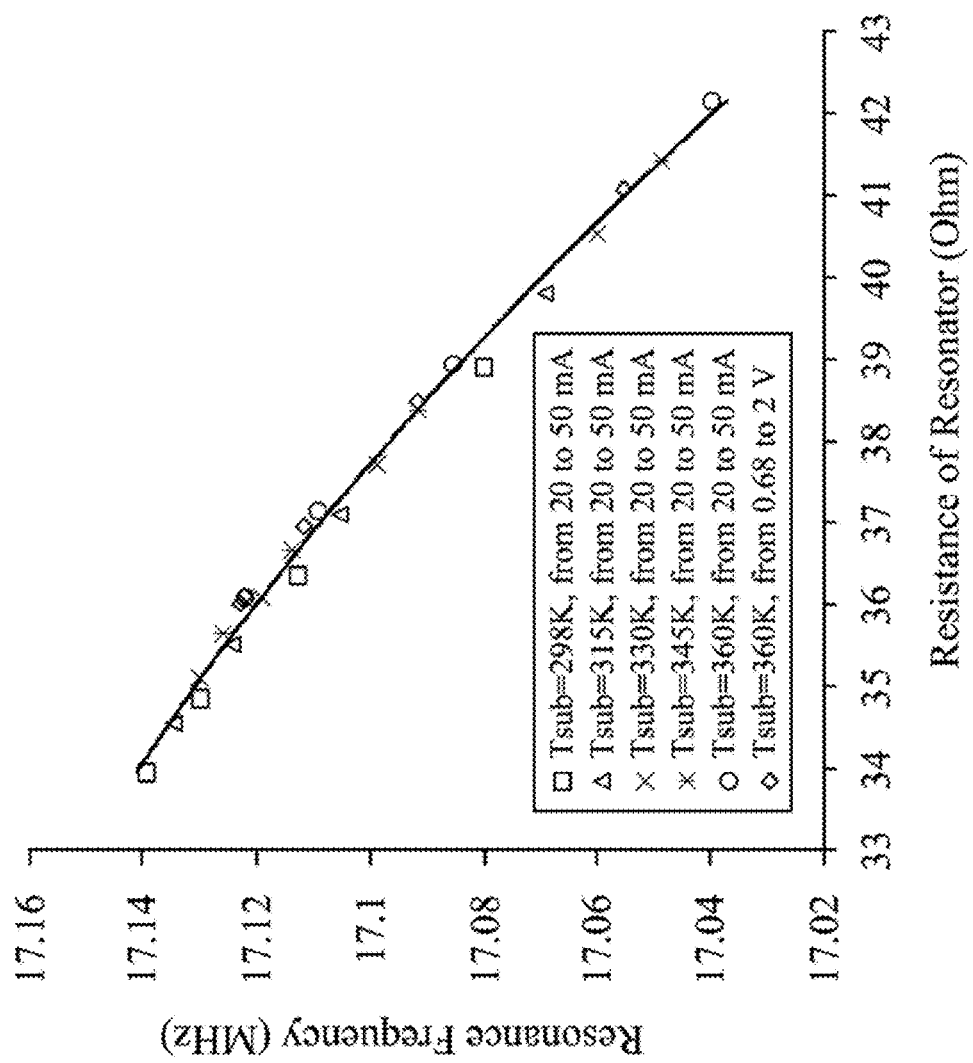
FIG. 6 illustrates a consistent resonance frequency—structural resistance relationship under arbitrary operation conditions of both the environment temperatures and electrical biasing conditions for the thermally-actuated MEMS resonator of FIG. 4.

FIG. 6 illustrates the relationship between the resonance frequency and the structural resistance under different operation environment temperatures and DC biasing conditions of the thermally-actuated MEMS resonator 100 of FIG. 4. In FIG. 6, the temperature-dependent resonance frequency is highly correlated with the structural resistance of the thermally-actuated MEMS resonator 100, but is not influenced by the environmental temperature or outer bias, which means if the structure resistance is settled, the resonance frequency is also determined at the same time. Actually, the thermally-actuated MEMS resonator 100 is a temperature sensor itself, and can detect the temperature variation based on the frequency shift or structure resistance shift. Therefore, to direct control the structural resistance of the thermally-actuated MEMS resonator 100 to be zero or to be stabilized in a predetermined value is equivalent to control the temperature stability of the thermally-actuated MEMS resonator 100, and therefore, all physical temperature-related characteristics such as resonance frequency will be controlled. Notably, the active temperature compensation method of the present disclosure is directly heating or cooling the thermally-actuated MEMS resonator 100. Furthermore, in addition to control the structural resistance of the thermally-actuated MEMS resonator 100 itself, another example is to add additional electric components that the structural resistance of the electric components is also varied with the environmental temperature variation. In summary, by the control of the structural resistance of the additional electric components, the temperature stability is also controlled; therefore the resonance frequency is controlled.

Figure 7:
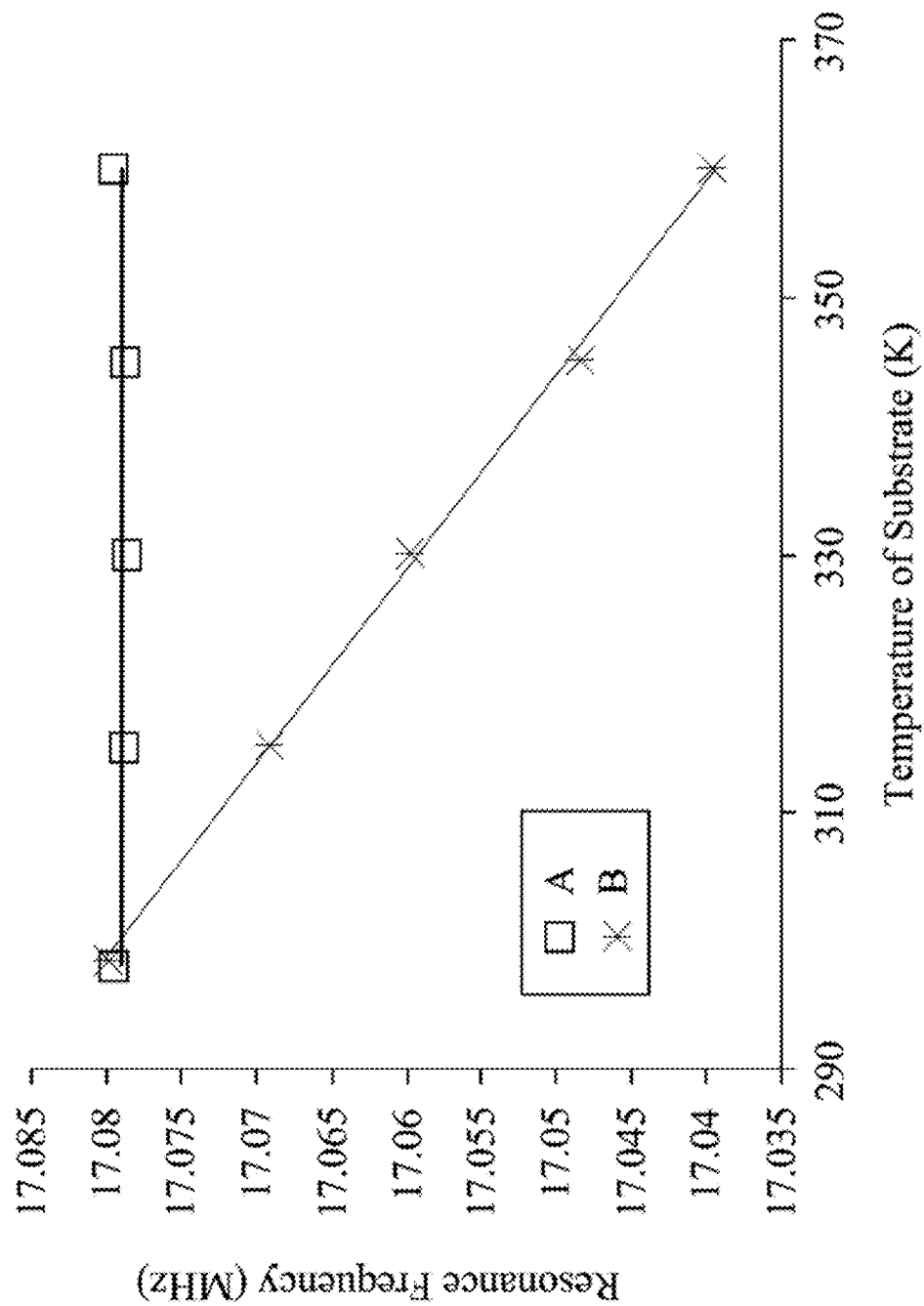
FIG. 7 is a resonance frequency versus environmental temperature diaphragm showing a comparison between the active temperature compensation method of the present disclosure and a conventional operation method applied to the thermally-actuated MEMS resonator.
Figure 8:
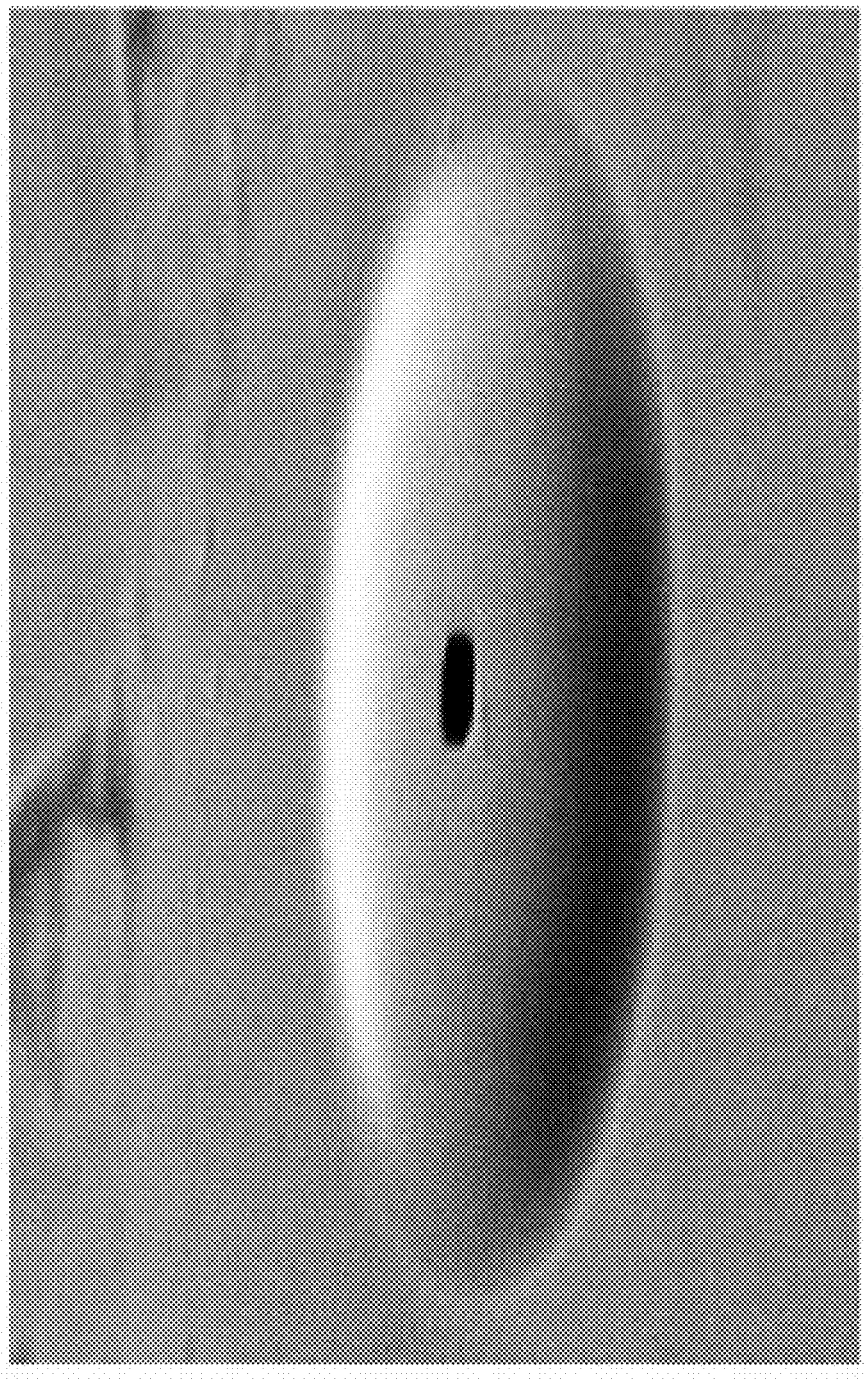
FIG. 8 to FIG. 12 show various shapes of structures of the thermally-actuated MEMS resonator.
Figure 9:
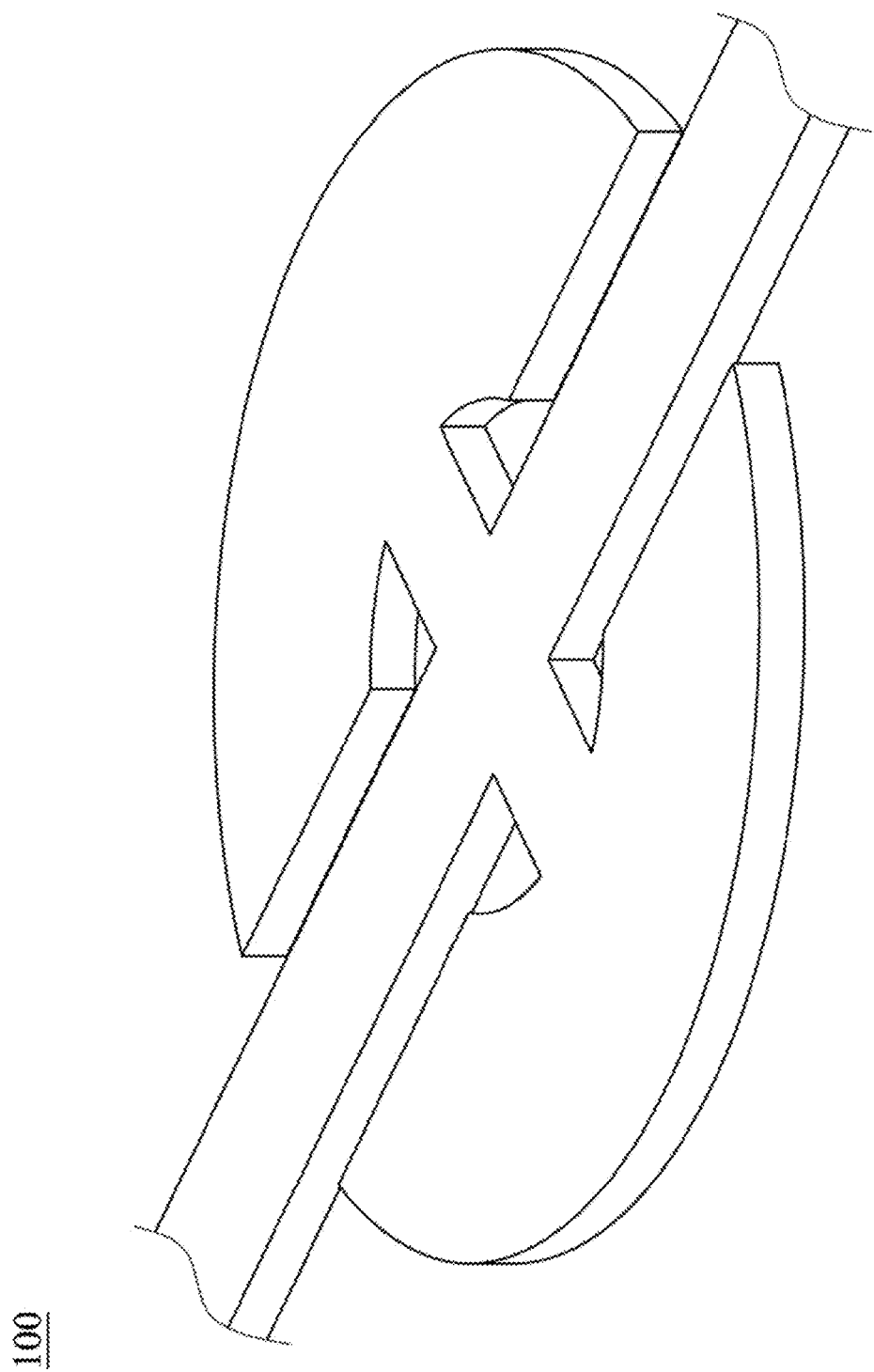
Figure 10:
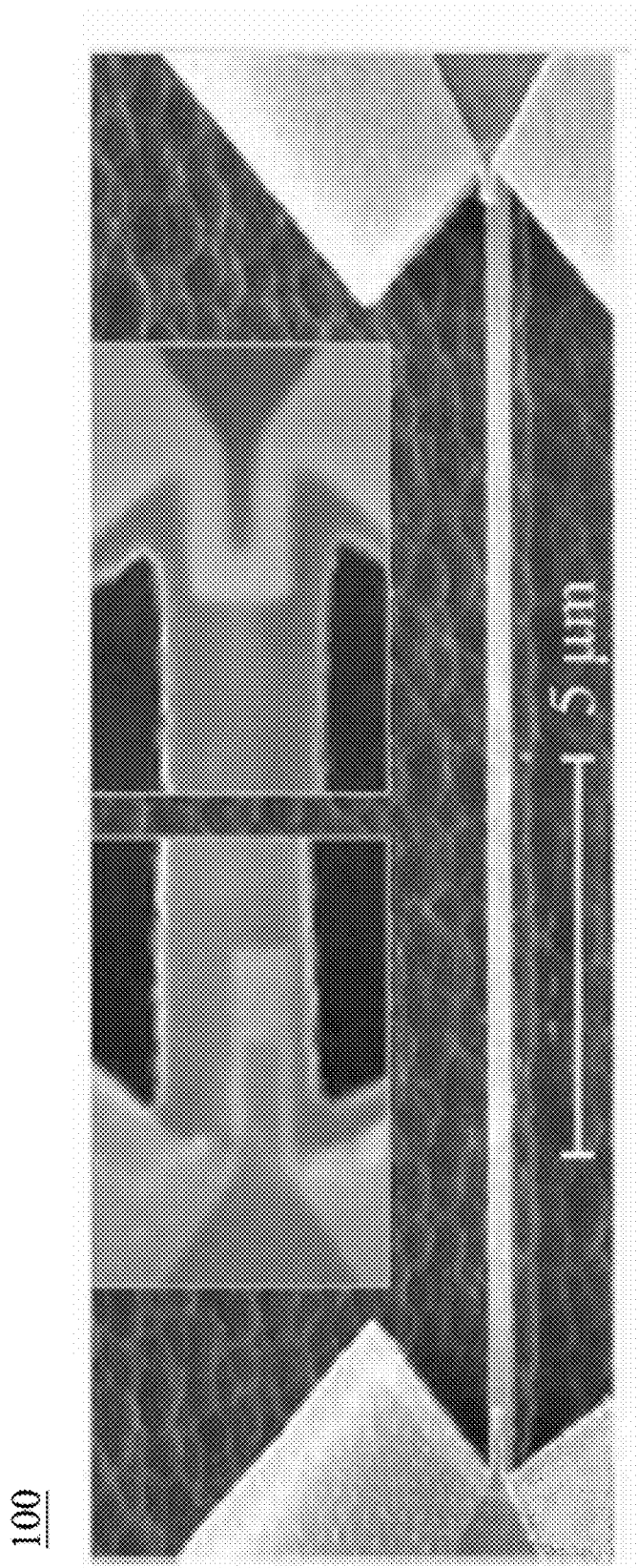
Figure 11:
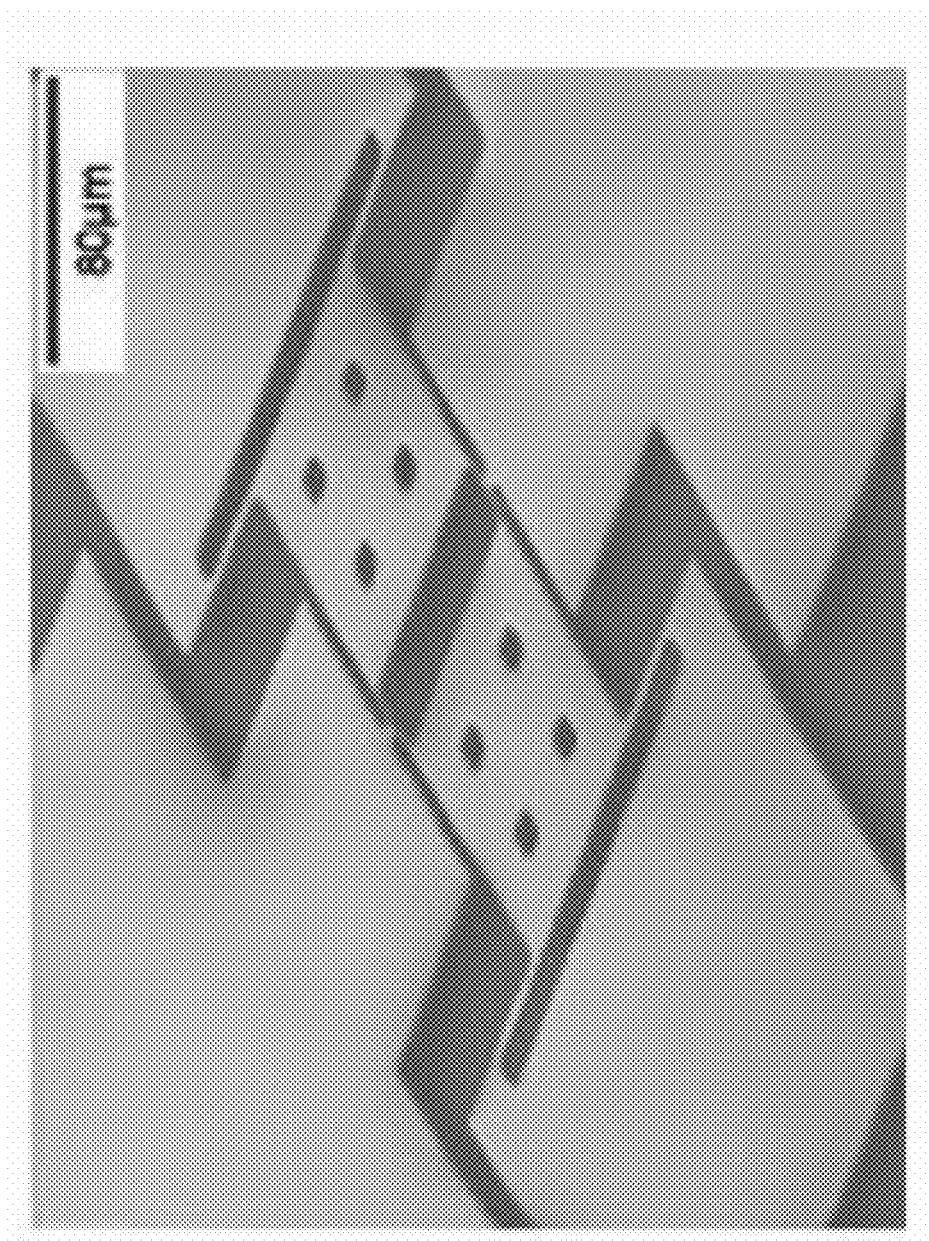
Figure 12:
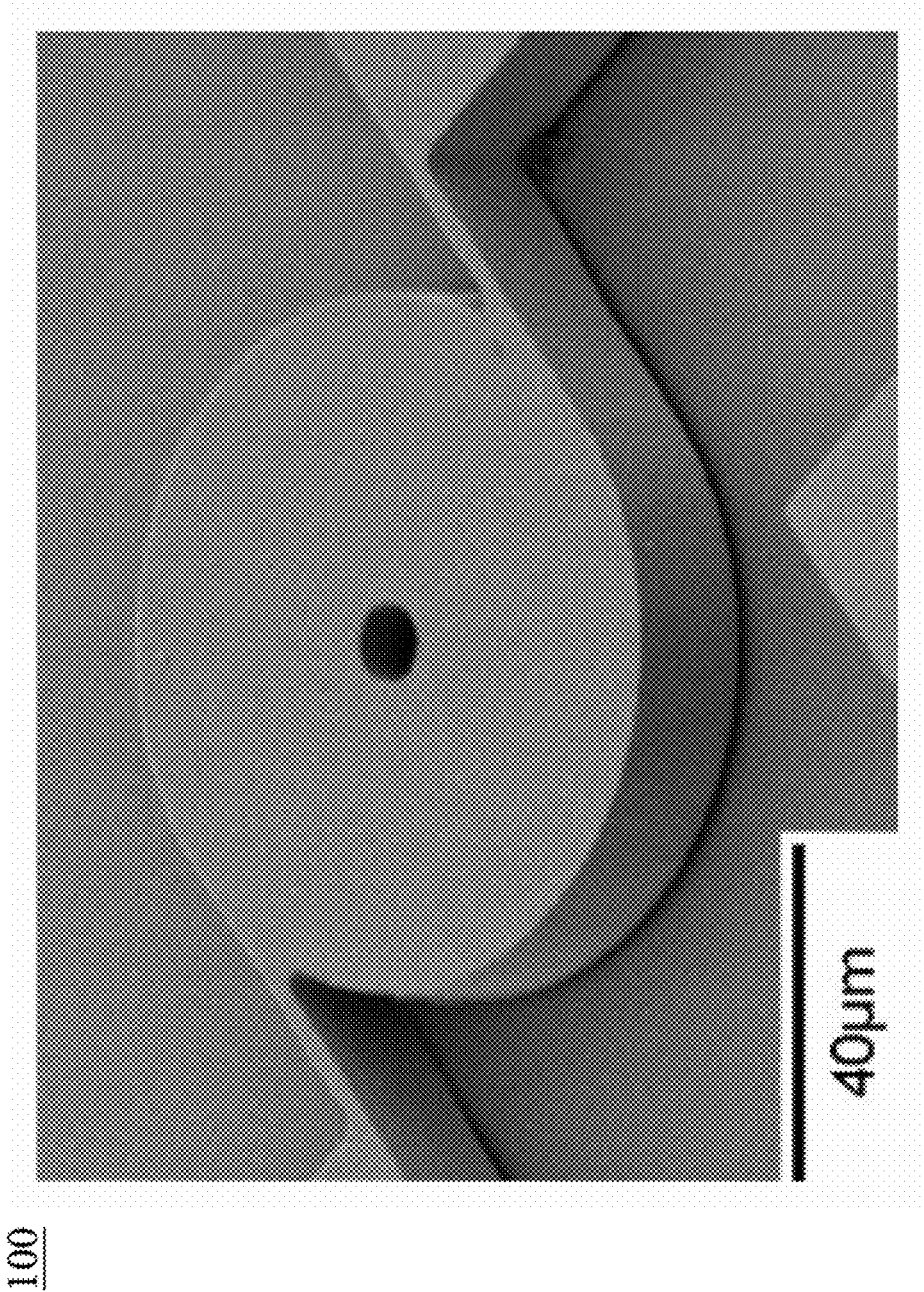

FIG. 7 is a resonance frequency versus environmental temperature diaphragm showing a comparison between the active temperature compensation method of the present disclosure and a conventional operation method applied to the thermally-actuated MEMS resonator 100. Curse A shows the active temperature compensation method (structural resistance control) of the present disclosure, and curve B shows the conventional operation method (current control). In curve A, it shows that the resonance frequency is almost a constant value in the substrate temperature ranged from 298K to 360K, and is not influenced by the temperature variation; the $TC_f$ is about 0.84 ppm/K. In curve B, in the same substrate temperature range, the resonance frequency of the thermally-actuated MEMS resonator 100 is dramatically influenced by the temperature variation, the $TC_f$ is about −38.6 ppm/K. In comparison, the active temperature compensation method of the present disclosure can get 46 times improvement than the conventional operation method. As a result, the resonance frequency variation is decreased from 2360 ppm to 52 ppm within the temperature range of 62K. It shows that the active temperature compensation method of the present disclosure can enhance the stability of the resonance frequency. In the future, the active temperature compensation method of the present disclosure can corporate with a passive temperature compensation method, such as doping of the material or making the resonance direction along with different crystal orientations, therefore, the performance can be further improved to +/−100 ppb/° C., even to +/−1 ppb/° C.

FIG. 8 to FIG. 12 show various shapes of structures of the thermally-actuated MEMS resonator 100. The thermally-actuated MEMS resonator 100 is vault-shaped (FIG. 8), disc-shaped (FIG. 9), beam-shaped (FIG. 10), twin-plate-shaped (FIG. 11), rotational disc-shaped (FIG. 12), ring-shaped, or fork-shaped.

To sum up, the present disclosure provides a MEMS resonator active temperature compensation method and the MEMS resonator. The structural resistance and the resonance frequency are varied with the environmental temperature variation. By this characteristic, it needs not to apply a bulky, power-inefficient, complicated temperature control and heating method to the MEMS resonator, but directly control the structural resistance shift value with directly heating on the resonance structure for controlling the resonance frequency, therefore the resonance frequency can keep to a constant value.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A MEMS resonator active temperature compensation method, comprising:
   providing a MEMS resonator, wherein a structural resistance of the MEMS resonator is varied with an environmental temperature;
   providing an electrical circuit, wherein the electrical circuit is electrically connected with the MEMS resonator for providing an adjustment mechanism to the MEMS resonator;
   forming a structural resistance shift value by the MEMS resonator according to a variation of the environmental temperature;
   forming a compensation value from the adjustment mechanism for controlling the structural resistance shift value, wherein the compensation value comprises one of an adjusting voltage, an adjusting current or an adjusting power to the MEMS resonator; and
   applying the one of the adjusting voltage, the adjusting current or the adjusting power to the MEMS resonator to keep the structural resistance shift value to be zero or to be stabilized in a predetermined value.

2. The MEMS resonator active temperature compensation method of claim 1, wherein the structural resistance is an electrical resistance of the MEMS resonator itself or an additional electrical resistance.

3. The MEMS resonator active temperature compensation method of claim 1, therein the adjustment mechanism is for providing the adjusting voltage, the adjusting current or the adjusting power to the MEMS resonator.

4. The MEMS resonator active temperature compensation method of claim wherein the MEMS resonator possesses shapes of a vault shape, a disc shape, a beam shape, a twin-plate shape, a rotational disc shape, a ring shape, or a fork shape.

5. The MEMS resonator active temperature compensation method of claim 1, wherein the MEMS resonator is a thermally-actuated MEMS resonator, a piezoelectric resonator, a capacitive resonator, a magnetic resonator, or piezoresistive-sensing resonator as long as the structure of resonator itself provides a proper resistivity which is temperature dependent.

6. A thermally-actuated MEMS resonator applied to the MEMS resonator active temperature compensation method of claim 1, comprising:
   a thermal actuator, comprising two beams, wherein the two beams are parallel to each other;
   two proof masses, wherein one of the proof mass s connected to one end of each of the beams, and the other proof mass is connected to the other end of each of the beams;
   two supporting beams, wherein one of the supporting beams is disposed on one side of the beam, and the other supporting beam is disposed on one side of the other beam;
   a first electrode electrically connected to one of the supporting beam; and
   a second electrode electrically connected to the other supporting beam.

7. The thermally-actuated MEMS resonator of claim 6, wherein the thermally-actuated MEMS resonator is made of an n-type SOI wafer or a p-type SOI wafer.

* * * * *